United States Patent [19]

Brus et al.

[11] Patent Number: 4,481,091

[45] Date of Patent: Nov. 6, 1984

[54] CHEMICAL PROCESSING USING ELECTROMAGNETIC FIELD ENHANCEMENT

[75] Inventors: Louis E. Brus, Madison, N.J.; Abraham Nitzan, Tel Aviv, Israel

[73] Assignee: AT&T Bell Laboratories, Murray Hill, N.J.

[21] Appl. No.: 544,396

[22] Filed: Oct. 21, 1983

Related U.S. Application Data

[63] Continuation of Ser. No. 234,710, Feb. 17, 1981, abandoned.

[51] Int. Cl.$^3$ ............................................. C07G 13/00
[52] U.S. Cl. ..................... 204/157.1 R; 204/157.1 H; 204/158 R; 204/158 HE
[58] Field of Search ................ 204/157.1 H, 157.1 R, 204/158 R, 158 HE

[56] References Cited

U.S. PATENT DOCUMENTS

| | | | |
|---|---|---|---|
| 4,051,005 | 9/1977 | Krascella | 204/157.1 H |
| 4,252,623 | 2/1981 | Vaseen | 204/157.1 H |
| 4,264,421 | 4/1981 | Bard | 204/157.1 H |
| 4,340,617 | 7/1982 | Deutsch | 204/157.1 H |
| 4,399,010 | 8/1983 | Lyon | 204/157.1 R |

Primary Examiner—John F. Niebling
Attorney, Agent, or Firm—Eugen E. Pacher

[57] ABSTRACT

The use of induced electromagnetic field enhancement to improve chemical processing is disclosed. Shape, image and resonant polarizability phenomena are used to obtain regions of increased field intensities where atomic and/or molecular interactions are advantageously affected to yield improved or increased chemical processing.

26 Claims, 5 Drawing Figures

CHEMICAL PROCESSING USING ELECTROMAGNETIC FIELD ENHANCEMENT

This application is a continuation of application Ser. No. 234,710, filed Feb. 17, 1981 abandoned.

BACKGROUND OF THE INVENTION

This invention involves the advantageous utilization of induced electromagnetic field enhancement in chemical processing.

DISCLOSURES OF INTEREST

Recent studies involving the interaction of electromagnetic radiation and matter have shown that radiation scattering phenomena are sometimes enhanced in the vicinity of rough surfaces. Exemplary enhanced phenomena include "Enhanced Raman Scattering" (ERS) observed when the scattering molecules are in the vicinity of surfaces with appropriate material and physical characteristics (J. E. Rowe, C. V. Shank, D. A. Zweiner and C. A. Murray, *Physical Review Letters*, 44, 1770 (1980); and D. A. Weitz, T. J. Gramila, A. Z. Genack and J. I. Gersten, *Physical Review Letters*, 45, 355 (1980)). Various theories are being advanced to explain this and other similarly enhanced scattering processes. As a result of such theoretical work, it has recently become apparent that these phenomena are associated with increased electromagnetic field intensities in the vicinity of certain surfaces due to resonance, image, and shape (or corona) effects.

Shape effects associated with enhanced processes are similar to those observed in the vicinity of pointed metals and referred to as "corona" or "lightening rod" phenomena. Classical electromagnetic theory indicates that in the vicinity of sharply pointed materials, especially metals, electromagnetic field intensities increase dramatically. Consequently, interactions between matter and electromagnetic radiation which are dependent on electromagnetic field intensities will be enhanced in the regions surrounding such pointed bodies, due to increased field values in these regions.

In addition, the electromagnetic field in the vicinity of certain materials will have increased values as a result of resonances in the dielectric polarizability of the material (J. I. Gerstein and A. Nitzan, *Journal of Chemical Physics*, 73, 3023 (1980); and J. I. Gersten, *Journal of Chemical Physics*, 72, 5779 (1980)). Such polarizability resonances are often referred to as plasmon or polariton modes and can be localized in small dielectric particles, or extended over a dielectric surface. The probability of exciting such resonances in dielectric materials by irradiation with an electromagnetic field depends on the dielectric properties of the material and its environment, and on the material's morphological nature (i.e., degree and character of the surface roughness). Excitation of such surface plasmon or polariton modes lead to increased electromagnetic field intensities near the surfaces of such materials. Absorption or scattering of electromagnetic radiation by atoms or molecules depends on the electromagnetic field intensity, and hence will be enhanced near field enhancing materials. (An equivalent heuristic model considers a particle or a surface protrusion as a very efficient energy absorber which may transfer some energy to nearby atoms or molecules thereby enhancing the excitation of, or scattering by, the atoms or molecules.)

Field enhancement due to the image effect is associated with the field due to the image charge distribution as discussed in the prior art.

It is of interest to compare these enhanced field phenomena with focusing effects such as, for example, those due to simple dielectric lenses and concave mirrors. Clearly, light passing through an appropriate lens will be focused to a limited region, and in that region the electromagnetic field associated with the light will be intensified. However, such focusing effects are limited by the wavelength of the light, and the photons associated with the field cannot be confined to a region with characteristic dimension smaller than the wavelength of the light. Hence, while regions of intense optical power may be formed by focusing coherent radiation, such as that obtained from lasers, the effect is fundamentally limited by the wavelength of the light. However, the enhancement phenomena described above do not have such limitations, and regions of field enhancement smaller than that encountered using lenses and concave mirrors may be obtained. Furthermore, electromagnetic radiation which has already been optically focused with lenses may be further enhanced using the resonance, image, or shape phenomena, thereby obtaining extremely small regions of extremely high intensity fields.

In the opposite spatial limit, lens optics is extremely cumbersome if large areas of high field intensities are desired. (Clearly, extremely large lenses which are impractical or impossible to fabricate could be used to focus light and obtain relatively large areas of increased field intensities. However, such techniques are highly impractical.) Resonance, image and corona phenomena, on the other hand, may be used in the vicinity of microscopic protrusions or particles distributed over large areas to obtain extended regions of substantially increased field intensities. The effect is similar to focusing light to a large number of points using a large number of lenses.

In order to understand the invention described in this specification, it is important to distinguish prior art surface chemistry, photochemistry, and surface photochemistry. These prior areas of study involve chemical interactions induced or effected by the interaction of molecules with light and/or with surfaces, but do not involve enhanced fields due to the resonance, image and corona phenomena described above.

SUMMARY OF THE INVENTION

This invention involves the use of induced electromagnetic field enhancement in improved chemical processing. Shape, image, and resonant polarizability phenomena are used to obtain regions of increased field intensities, where atomic and/or molecular interactions are advantageously affected to yield improved or increased chemical processing.

According to the invention, irradiating, with electromagnetic radiation comprising a given wavelength, an appropriate body of characteristic dimension between about 5 Å and about the given wavelength, results in enhancement of the electromagnetic field in the vicinity of the body. Placing atoms or molecules, capable of undergoing a photochemical reaction when exposed to radiation of the given wavelength, into the region of enhanced field adjacent to but spaced apart from the body results typically in an increase of the reaction rate over that observed absent the field enhancement. Exemplary reactions that can often be advantageously affected by this technique are photocatalysis, surface modification, image formation, isotope separation, heterogeneous or homogeneous chemical synthesis, and chemical purification via selective reaction of one component or isomer in a mixture.

DETAILED DESCRIPTION OF THE INVENTION

A. Field Enhancement

Figure 1:
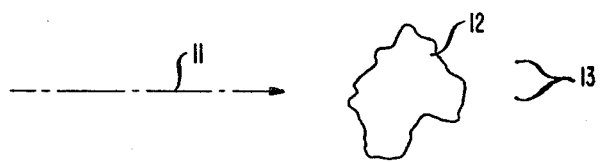
FIG. 1 is a schematic representation of chemical processing using electromagnetic field enhancement.

It is known that the electromagnetic field in the region of a pointed body near the point, or in the region of a microscopic body with appropriate dielectric properties, may be significantly increased. The latter dielectric effect stems from the fact that the field in the vicinity of an appropriate dielectric body may be viewed as the sum of two components—the background or incident field, present without the body, and the field induced by the polarized dielectric body (J. I. Gersten and A. Nitzan, *Journal of Chemical Physics*, 73, 3023 (1980); and J. I. Gersten, *Journal of Chemical Physics*, 72, 5779 (1980)). Since the two fields must be added to obtain the resultant net field in the vicinity of the dielectric body, a resonance in the induced field will result in large field intensities in the vicinity of the dielectric body. It should be noted that the induced field may have a sign opposite to that of the incident field, and in such situations field intensities lower than that of the incident field may result, if the induced field has values approximately equal to that of the incident field. The invention makes use of enhanced field intensities due to resonance, image or shape phenomena to stimulate or catalyze appropriate chemical processes. Regions of reduced field intensities may also be used advantageously in chemical processing, and fall within the term "enhanced" as used here, and within the scope of this invention.

B. Alternative Methods of Field Enhancement

Creation of fields with enhanced intensity by other techniques may be found in the literature. Lenses and concave mirrors, for example, may be used to focus light to limited regions of space thereby obtaining enhanced fields. However, such focusing effects are inherently limited by the wavelength of the light, and even laser light cannot be focused to spatial regions of dimension less than the wavelength of the light. On the other hand, and as previously discussed, it is impractical to obtain extended regions of enhanced field intensities using lens optics. The resonance, image and shape phenomena discussed in this application, however, may involve field enhancement over regions smaller (i.e., with higher resolution) or larger (similar to the use of many lenses) than that possible using lens optics.

C. The Invention

The invention resides in the realization that electromagnetic field intensities enhanced by resonance, image, or shape effects may be used to obtain improved chemical processing. Any chemical process affected by the presence of an electromagnetic field may be improved using this technique. Such processes include chemistry involving reactants generated or activated by photochemical processes, or chemistry with reaction rates affected by the presence of electromagnetic fields. Reactants may be generated in the course of photochemical processes by (1) exciting molecules, by direct excitation or energy transfer, to states for which chemical processes may be more likely, (2) ionizing or dissociating species yielding desired products, or products which then partake in chemical processes, or (3) exciting states which then decay to other states that actively participate in ensuing chemical reactions. These three processes may be generically characterized by absorption of one or more photons followed by subsequent chemical reaction. The enhanced field may also advantageously affect reaction rates by changing reactant properties without absorption of photons.

D. Details of Field Enhancement

When specific types of bodies are irradiated with electromagnetic radiation appropriate field enhancement will result. Such field enhancement may advantageously affect chemical processes among reactants which are located within the enhanced field. Bodies capable of appropriately enhancing fields will generally have characteristic dimensions of between 5 Angstroms and the wavelength of the irradiating field. Irradiating electromagnetic fields will have wavelengths between 0.05 and 60 microns, or alternatively between 0.2 and 20 microns.

In addition, in order for the field to be enhanced by appropriate dielectric resonance phenomena, the body must have a polarizability resonance in the spectral vicinity of the wavelength of the irradiating electromagnetic field. In spherical bodies, this resonance occurs at wavelengths for which the real part of the relative dielectric function will be approximately $-2\pm 1$, or $-2\pm .5$, and the imaginary part of the dielectric constant will be less than one. (In this specification the term relative dielectric function $\epsilon(\omega)$ stands for the expression $\epsilon_p(\omega)/\epsilon_m(\omega)$, where $\epsilon_p$ is the dielectric function of the field enhancing particle, and $\epsilon_m$ is the dielectric function of the surrounding medium. The angular frequency of the radiation is symbolized by $\omega$.)

While it has been indicated that the field enhancing bodies will generally have characteristic dimensions of between 5 Angstroms and the wavelength of the irradiating field, it should be understood that the bodies need not be spherical. The field enhancing bodies may just as well be irregularly shaped with the required characteristic dimensions. While the particular shape of the irregularly shaped field enhancing body may shift the effective wavelength of any dielectric resonance, the basic field enhancement phenomena will, nevertheless, effectively occur.

A simple schematic representation of an embodiment of the invention is shown in FIG. 1. In this figure, 11 represents appropriate electromagnetic radiation irradiating the field enhancing particle, 12 and reactants, 13. The field in the vicinity of the particle is increased and chemical processes involving one or more reactants, 13, are thereby enhanced.

Figure 2:
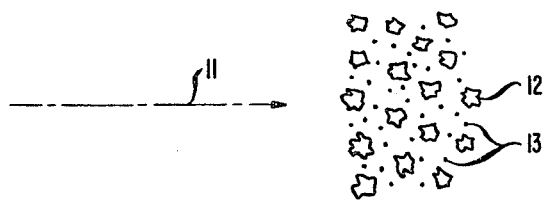
FIG. 2 shows an embodiment of the invention with a multiplicity of field enhancing bodies.

Clearly, most, if not all, applications of this invention will involve more than one field enhancing particle. For example, as shown in FIG. 2, the invention may be practiced with a multitude of field enhancing bodies, 12, perhaps suspended in a liquid, solid or a gas comprising reactant species, 13, which are appropriately irradiated with electromagnetic radiation 11.

Figure 3:
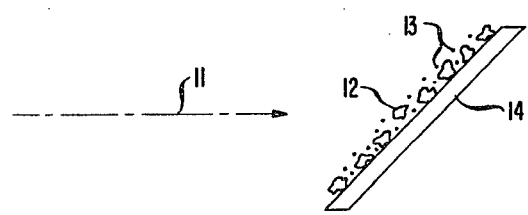
FIG. 3 depicts an embodiment wherein the field enhancing bodies are deposited or formed on the surface.

As shown in FIG. 3, the field enhancing particles 10 may be deposited or formed on a surface, 14. Irradiation in this case need not be at the angle shown, but may be at any orientation set to maximize desirable processing parameters. A particular embodiment of FIG. 3 involves a solid body whose surface is appropriately rough thereby effectively simulating an aggregation of field enhancing particles. The rough surface may be grown, deposited or formed by any appropriate process (for the example of roughened electrochemical electrodes, see R. P. Van Dyne in *Chemical and Biological Applications of Lasers*, edited by C. B. Moore, Vol. 4 (Academic, N.Y., 1978)). Molecules on or adjacent to the rough surface may partake in enhanced chemical processes as a result of the enhanced field.

While the field enhancement associated with the corona effect is wavelength independent, the field enhancement associated with the resonance phenomenon is wavelength as well as shape dependent. The wavelength dependence associated with the resonance field enhancement may shift depending upon the number density and shapes of the field enhancing particles and the material composition of the medium surrounding the field enhancing body. The specification of the resonance condition for ensembles of enhancing bodies may be determined by theories readily available in the literature (M. Moscovitz, *Journal of Chemical Physics*, 69, 4159 (1978); and C. G. Granquist and O. Hunderi, *Physical Review* B, 16, 3513 (1977)).

While the material composition of the field enhancing body may fall within a broad category of materials for which enhanced fields result, the following may assist the practitioner in initial selection of appropriate field enhancing materials.

The shape dependent lightening rod effect will be strongest with most, if not all, metals. In this connection, the term metal implies that the absolute value of the dielectric coefficient at the radiation frequency is much larger than one.

Resonant field enhancement will occur in the vicinity of appropriately shaped materials of the following composition. In the UV and visible, up to wavelengths of about 7500 Angstroms, metals which can support surface plasmons such as silver, gold, copper, etc., may be used. In addition, dielectric solids, such as cadmium sulphide, anthracene, or most solid organic dyes having internal electronic excited states at specific wavelengths may be used.

In the infrared wavelength range, i.e., for wavelengths greater than about 7500 Angstroms, semiconductors, with either n or p doping sufficient to give free carrier plasmon resonances at the desired wavelength, may be used. Such semiconductors include silicon, germanium, indium antimonide, gallium arsenide, etc. Doped ionic semiconductors exhibiting interacting lattice vibration and phasmon resonances, such as doped silicon carbide, may also be used. Dielectrics with ionic optical lattice vibrations yielding resonances at specific wavelengths, such as silicon carbide in the vicinity of 10.6 microns, magnesium oxide in the vicinity of 16 microns, and aluminum oxide at a number of infrared wavelengths, may be used. Small bandgap semiconductors with polarizability resonances near the optical absorption edge, such as gallium aluminum arsenide in the vicinity of 1.3 microns, may also be used.

The field enhancing body does not have to be compositionally homogeneous. The body may be a solid phase solution of two materials or may be made of inclusions of one material inside another. The appropriateness of the material composition of the body is determined by the existence of resonance conditions in the effective or net dielectric function of the final composite material.

The field enhancing body may in itself have an internal structure designed either to produce a resonance at the specified wavelength or, as described below, to prevent reactant molecules from reaching certain volumes of space. For example, the body could be approximately spherical with an inner core and an outer surface layer of different materials.

E. Details of Enhanced Chemistry

While enhanced electromagnetic fields have recently been used to enhance phenomena such as light scattering, field enhancement has not been used to improve or enhance chemical processing. The failure to apply field enhancement to chemical processing may be attributed partly to the fact that the body which is the source of field enhancement, may also provide a channel for energy damping or deexcitation of molecules excited in the enhanced field. The time dependence of such damping is critical if chemical processes, which are also time dependent, are to be advantageously enhanced. For example, applicants have found that in the vicinity close to the field enhancing particle (i.e., within 10 Angstroms) the energy transfer from the excited molecule to the field enhancing particle is usually so rapid that chemistry is only minimally enhanced. However, in regions removed from the field enhancing particle, the "damping" energy transfer from excited molecule to field enhancing particle usually decreases rapidly, while the field enhancing phenomenon still remains significant. Consequently, in regions somewhat removed (e.g., more than 0.1 particle radii, or greater than 0.5, 3, 10 or 25 Angstroms in appropriate cases) from the field enhancing particle, chemical processing may be significantly enhanced without deleterious interferences due to damping phenomena. In accordance with this realization, this invention may be advantageously practiced using field enhancing particles which are coated with a layer of a neutral material so as to increase the likelihood that molecules which will partake in subsequent chemistry do not approach the field enhancing particles any closer than the optimum spacing required for enhanced chemistry.

In addition to the optimum spacing which plays a significant role in enhanced chemistry, other linewidth and wavelength overlap considerations may also play a significant role in the efficiency of energy transfer from the field enhancing particle to the reactant molecule. For example, the nonresonant nature of Raman scattering implies that overlap between the molecular resonance and the particle polarizability resonance is not critical for enhancement. However, in enhanced chemical reactions where on-resonance excitation of molecules is of significance, one must consider not only the absolute magnitude of the field enhancing phenomena, but also the wavelength behavior of the field enhancement. Efficiency of induced chemical processing will be maximized when the molecule absorption and the radiation wavelength are in near resonance (e.g., within 4 percent of each other in some cases). However, for cost effectiveness, it may be more advantageous to work with a system in which the magnitude of field enhancement is less dramatic, but the wavelength range over which the enhancement occurs is broad enough to overlap with the lineshape of the absorbing molecule. Alternatively, a molecule may be chosen, in large part, for lineshape characteristics which will overlap with those of the field enhancing particle. In such off-resonance embodiments, consideration must be given to the constructive or destructive interference of the induced field with the initial field, in determining whether to operate above or below resonance. (A more detailed discussion of the relevant mathematical consideration appears in section G below.)

Advantageous use may also be made of intramolecular decay processes of excited molecules in order to maximize chemical processing when the field is enhanced via wavelength dependent polarizability resonances. If the excited state from which reaction occurs can be produced by internal relaxation from some higher lying state within the molecule, it may be advantageous to choose a radiation wavelength and particle resonance which are in resonance with absorption into this higher lying state. Enhanced absorption into the higher state will be followed by relaxation into the reactive state. The competing transfer of energy from the excited molecule (in the reactive state) to the enhancing particle, which is dependent on the dielectric properties of the particle and, in particular, is largest for $\omega$ satisfying $\epsilon(\omega) = -1$ (if the molecule to particle distance is much smaller than the particle characteristic size) will be less than that which would have occurred if enhanced absorption has occurred directly to the reacting state.

While there may be many plasmon modes associated with the field enhancing particle, only the dipole modes are effective in enhancing absorption by the molecule for dimensional values of the field enhancing particle much less than the wavelength of light. Dimensional values of the field enhancing particle which are on the order of magnitude of the exciting light wavelength will result in higher order modes becoming more effective in transferring energy, and may be advantageously used in this invention.

F. Specific Suggested Embodiments

Many specific embodiments of this invention may be divided broadly into three categories, (a) photocatalysis of chemical reactions, (b) surface modification of solids and (c) lithographic or photographic image formation.

In exemplary embodiments of (a) or (b) the enhancing bodies are distributed either over a surface or throughout a gaseous or liquid medium. The desired photochemical reaction is accelerated in the regions of enhanced field. The absorbing molecule may fragment, ionize, or tautomerize, react with another nearby molecule, or diffuse to the surface of either the enhancing body or another nearby body and undergo surface reaction.

In embodiments involving rough surface configurations the enhancing bodies may be distributed over a substrate of another material. In this case, it is possible that excited molecules produced in the enhanced field region actually react with the substrate material, and may thus modify the substrate surface.

The purpose of the desired photochemistry may include either heterogeneous or homogeneous chemical synthesis, isotope separation via selective reaction of one isotope, chemical purification via selective reaction of one component or isomer in a mixture, and surface modification (e.g., activation, passivation, corrosion protection, controlled roughening, etc.). The field enhancing bodies may be irradiated with either monochromatic light, to be absorbed only by a desired species, or by polychromatic light (e.g., sunlight or radiation from incandescent sources). In the latter case, advantageous use may be made of the wavelength specific nature of plasmon resonances to enhance only one component of the polychromatic light. So, for example, isotope separation may be achieved by wavelength specific photochemical activation of only one isotope in a mixture of two or more isotopic species even when polychromatic light is used. The photochemical processes to be enhanced may have rates proportional to either the first or higher powers of the electromagnetic field intensity. Examples of higher order processes include two or more photon absorption leading to unimolecular reaction (e.g., fragmentation, ionization, or isomerization), or bimolecular reaction. The rates of higher order processes will be enhanced more than lower order processes since these processes depend on higher powers of the enhanced field. Enhancement of such higher order processes may make possible photochemical applications that would be impracticably slow without the practice of this invention.

In lithographic or photographic applications a desired image is produced by photochemical means on a surface or in a thin material layer on a surface (e.g., the resist). In such cases, the enhancing bodies may be distributed on the surface or throughout the thin resist layer.

Two separate techniques for image formation may be considered. In the first technique the enhancing bodies are uniformly distributed and an optical image is projected onto the surface using an external optical system. The enhanced photochemistry of image formation associated with this invention yields an increased sensitivity or photographic speed. Photochemical image formation using two or more photon absorption can be envisioned in view of this invention. In the second image formation configuration, the image to be formed is contained in a prearranged nonuniform distribution of enhancing particles on a surface. The photochemical image is formed when appropriate radiation is uniformly distributed across the surface. This second method has a distinct advantage in that image resolution is not limited by wavelength, as in a conventional optical photoresist and in the first technique described above, but is rather determined by the size and precision of location of enhancing particles on the surface. Resolutions limited only by the size of the field enhancing particles may, as discussed above, be as small as ~10 Angstroms.

G. General Mathematical Description

While the above discussion has been in nonmathematical terms, the more sophisticated practitioner in the art may benefit from the following more detailed description of field enhancement via a single sphere.

Consider a molecule at distance d from the surface of a material sphere of radius a. The molecule is modeled as a polarizable absorbing point dipole with characteristic frequency $\omega_l$. Both a and d are much smaller than the field wavelength $\lambda$, and we additionally assume $d<<a$. Sphere excitation is characterized by multipole plasmon modes of frequency $\omega_l$ and damping rates $\lambda_l$, $\epsilon(\omega_l+i\lambda_l)=-(l+1)/l$, $(l=1,2,3,\ldots)$. $\epsilon$ is the ratio between the dielectric functions of the sphere and of the surrounding medium. The radiation field principally interacts with the dipolar $l=1$ mode, which we approximate as a Drude oscillator with polarizability parameters taken from experimental $\epsilon(\omega)$ data. All the sphere multipoles are involved in accepting energy from the excited molecule.

The dynamical behavior is described by an oscillator representing the molecule coupled to a triply degenerate oscillator representing the dipolar $(l=1; m=0, \pm 1)$ sphere modes. The coupling is due to the dipole-dipole interaction, decreasing as $(a+d)^{-3}$. In addition, the molecule decays with a rate given by a free molecule term, and a surface induced term which arises from the molecular interaction with all $l>1$ modes. To a good approximation this can be calculated using the plane image dipole field. The molecular polarizability is calculated from experimental radiative lifetime data. Our model differs from that used to discuss intermolecular energy transfer in that (a) the sphere oscillator is triply degenerate and its polarizability is macroscopically large, and (b) the presence of a macroscopic body increases the nonradiative decay rate of the molecule. We now discuss two examples illustrating different types of enhanced photochemical processes.

Figure 4:
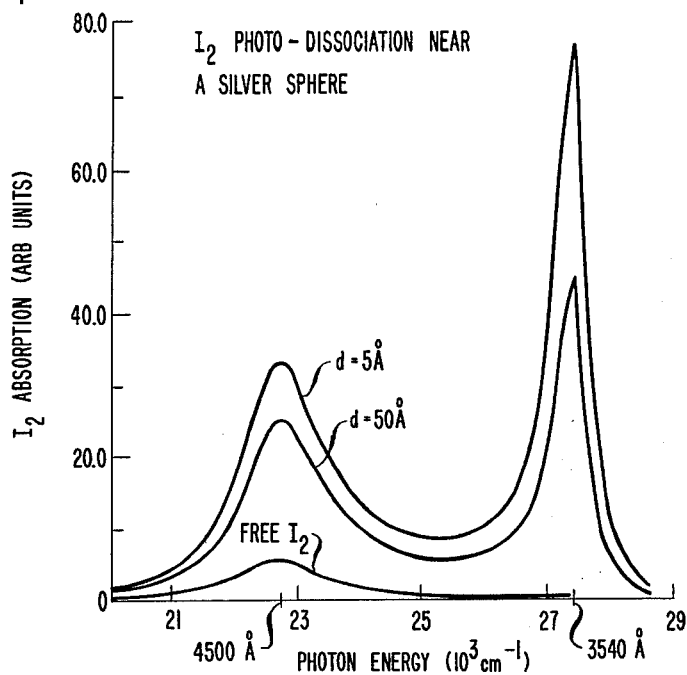
FIG. 4 shows computed effective absorption cross section vs. photon energy for a model of $I_2$ dissociation, and FIG. 5 gives computed molecular absorption of energy from 10.4 μm incident radiation by $SF_6$ molecules near a doped InSb sphere.

$I_2$ photodissociation near 4500 Angstroms is a 1-photon process with a short ($\sim 10^{-14}$ sec) excited state lifetime. We have simulated the continuous $I_2$ absorption by a broad Lorentzian resonance. FIG. 4 shows the steady-state $I_2$ dipole excitation lineshape for several values of distance d near an Ag sphere. The sphere dipolar resonance occurs near 3540 Angstroms. The lineshape in FIG. 4 directly gives the excitation spectrum for I atom production in view of the short $I_2$ lifetime. There are two apparent effects leading to enhanced photochemistry, (a) the integrated intensity of the 4500 Angstroms absorption increases as d decreases due to enhanced local field at this wavelength, and (b) there is a new photodissociation maximum at the sphere wavelength 3540 Angstroms, resulting from sphere absorption followed by energy transfer to $I_2$.

Figure 5:
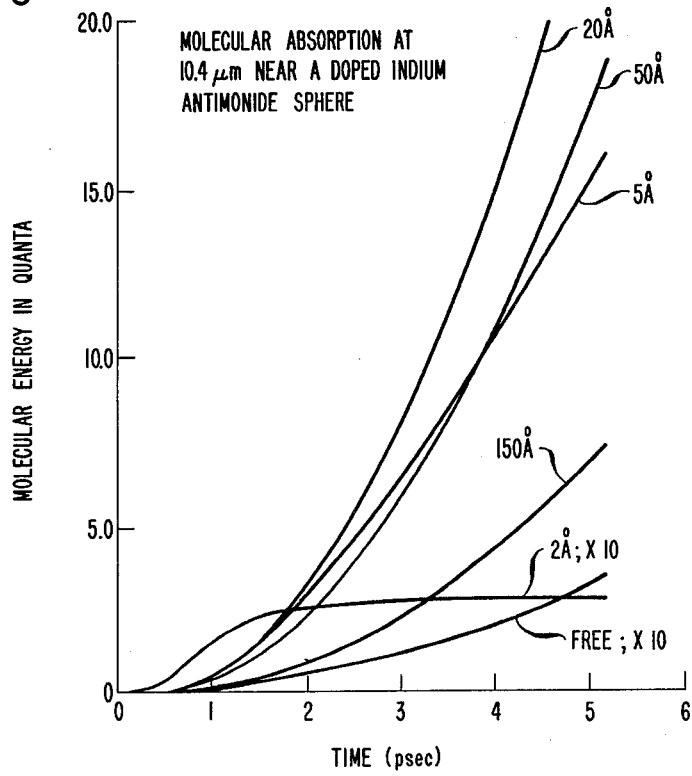

We have also modeled the IR multiphoton dissociation of a molecule near an n-type InSb sphere doped to give a free carrier plasmon resonance nearly coinciding with a $CO_2$ laser line. We could alternately employ a dielectric material such as SiC with an ionic optical phonon dipolar resonance. FIG. 5 shows the energy of this molecule when irradiated by a $CO_2$ laser at $10.4\mu$. Enhancement ratios of $10^2-10^3$ in pumping rate may be obtained. Such enhancement may occur within a few picoseconds of initiation of irradiation. The molecule is modeled as a damped harmonic oscillator with parameters corresponding to the $0\rightarrow 1\nu_3$ transition of $SF_6$ (965 cm$^{-1}$), and the doping in InSb was set to provide a dipole sphere resonance at 967 cm$^{-1}$. The incident intensity corresponds to a pulse power of $2\times 10^8$ Watt. It is seen from FIG. 5 that the highest rate of energy accumulation by the molecule occurs at relatively large ($\sim 20$ Angstroms) distances. This is due to the sharp dependence ($\sim d^{-3}$) of the molecular damping, in contrast to the mild dependence ($\sim (d+a)^{-3}$) of the field enhancement, on the molecule-surface distance. However, even at $d=150$ Angstroms the effective absorption cross-section is enhanced considerably. Occurrence of enhanced processes so soon after initial irradiation shows that enhanced photochemical processes may compete successfully with rapid dissipative processes.

ILLUSTRATIVE EMBODIMENTS (1) Irradiating, with electromagnetic radiation of approximately 3540 Å wavelength, Ag spheres of appropriate size (i.e., diameter within the above disclosed range, namely, between about 5 Å and the radiation wavelength) produces a high dissociation rate in $I_2$ molecules located about 5 Å from the sphere surface, and a somewhat lower rate for $I_2$ molecules about 50 Å from the surface. In the absence of the field enhancing Ag spheres the dissociation rate is essentially zero, as shown by FIG. 4.

(2) Irradiating, with pulsed $CO_2$ laser radiation (10.4 $\mu$m, $2\cdot 10^8$W pulse power), InSb spheres of appropriate size (i.e., with diameter within the above disclosed range, namely, between about 5 Å and the radiation wavelength) doped n-type to yield a dipole sphere resonance at 967 cm$^{-1}$ (10.34 $\mu$m), results in increased molecular absorption in $SF_6$ molecules located between about 5 Å and about 150 Å from the surface. For instance, 4 psec after commencement of the irradiation, molecules located 5, 20, 50, and 150 Å from the surface on average will have accumulated the energy corresponding to 11, 16, 11, and 4 quanta of radiation, respectively, whereas molecules located 2 Å from the surface will have accumulated only 0.25 quanta, and free molecules (i.e., those not adjacent to a field-enhancing sphere) only 0.2 quanta, as shown by FIG. 5.

What is claimed is:

1. A method for photochemically reacting an atom or molecule having at least one absorption wavelength, the method comprising
   (a) irradiating the atom or molecule with reaction-effecting electomagnetic radiation comprising a given wavelength, the invention CHARACTERIZED IN THAT,
   (b) during at least a portion of the irradiation, a field enhancing body of characteristic dimension between about 5 Å and the given wavelength is also irradiated with the electromagnetic radiation, the field enhancing body, when irradiated, having an associated enhanced field, due to a dielectric polarizability resonance in the spectral region of the given wavelength, a corona effect, or an image effect,
   (c) the field enhancing particle is selected to have its polarizability resonance in the spectral range of the given wavelength, and
   (d) the given wavelength is selected to be in the spectral range of the absorption wavelength of the atom or molecule.

2. The method of claim 1 wherein the given wavelength is between 0.05 to 60 microns.

3. The method of claim 2 wherein the given wavelength is between 0.2 and 20 microns.

4. The method of claim 1 wherein there is a multitude of atoms or molecules.

5. The method of claim 4 wherein there is a multitude of field enhancing bodies.

6. The method of claim 5 wherein the atoms or molecules are part of in a gas, a solid or a liquid.

7. The method of claim 6 wherein the field enhancing bodies are distributed on a solid substrate.

8. Method of claim 1, wherein the photochemical reaction is at least part of a photocatalytic process, or of a surface modification process, or of an image formation process, or of an isotope separation process, or of a heterogeneous chemical synthesis process, or of a homogeneous chemical synthesis process, or of a process for chemical purification via selective reaction of one component or isomer in a mixture.

9. Method of claim 8, wherein the photochemical reaction is at least part of an image formation process, the field enhancing bodies are distributed on a solid substrate, and the substrate is selectively irradiated.

10. The method of claim 9 wherein the substrate is selectively radiated through the use of a mask.

11. Method of claim 8, wherein the photochemical reaction is at least part of an image formation process and the field enhancing bodies are selectively distributed on a solid substrate.

12. Method of claim 8, wherein the given wavelength is less than about 7500 Å and the field enhancing body comprises metal or a solid dielectric.

13. Method of claim 12, wherein the metal is selected from the group consisting of Ag, Au, and Cu.

14. Method of claim 12, wherein the solid dielectric is selected from the group consisting of cadmium sulfide, anthracene, and organic dyes.

15. Method of claim 8, wherein the given wavelength is greater than about 7500 Å, and the field enhancing body comprises doped semiconductor material, dielectric material with ionic optical lattice vibrations yielding a resonance at a wavelength between 7500 Å and 60 μm, or small bandgap semiconductor material with a polarizability resonance near the optical absorption edge of the material.

16. Method of claim 15, wherein the doped semiconductor is selected from the group consisting of doped Si, Ge, InSb, and GaAs.

17. Method of claim 15, wherein the doped semiconductor is a doped ionic semiconductor.

18. Method of claim 15, wherein the dielectric material is selected from the group consisting of silicon carbide, magnesium oxide, and aluminum oxide.

19. Method of claim 15, wherein the small bandgap semiconductor is gallium aluminum arsenide.

20. Method of claim 1, wherein the radiation is substantially coherent radiation from a laser.

21. Method of claim 1, wherein the radiation is incoherent radiation.

22. Method of claim 1, wherein the given wavelength is within 4% of the absorption wavelength of the atom or molecule.

23. Method of claim 1, wherein the field enhancing body is a member of an ensemble of field enhancing bodies, and the collective dielectric resonance of the ensemble of field enhancing bodies is in the spectral region of the given wavelength.

24. Method of claim 23, wherein the field enhancing body is suspended in a liquid, solid, or gas, the suspension medium comprising the atom or molecule.

25. A method for photochemically reacting an atom or molecule, the method comprising
   (a) irradiating the atom or molecule with reaction-effecting electromagnetic radiation comprising a given wavelength, the invention CHARACTERIZED IN THAT
   (b) during at least a portion of the irradiation, a field enhancing body, of characteristic dimension between about 5 Å and the given wavelength, is also irradiated with the electromagnetic radiation, the field enhancing body when irradiated with electromagnetic radiation of the given wavelength, having an associated enhanced field, due to a polarizability resonance in the spectral region of the wavelength, a corona effect, or an image effect, and
   (c) the method further comprises providing means for preventing the approach, to within less than 3 Å or one tenth of the characteristic dimension of the field enhancing particle, whichever is less, of the atom or molecule to the field enhancing body.

26. Method of claim 25, wherein the approach-preventing means either comprise a neutral-material coat substantially surrounding the field enhancing body, or comprise a layer of material, disposed on a surface, in which the field enhancing body is substantially embedded.

* * * * *

UNITED STATES PATENT AND TRADEMARK OFFICE
CERTIFICATE OF CORRECTION

PATENT NO. : 4,481,091

DATED : November 6, 1984

INVENTOR(S) : Louis E. Brus and Abraham Nitzan

It is certified that error appears in the above-identified patent and that said Letters Patent is hereby corrected as shown below:

In the Specification, column 4, line 47, "$\epsilon(\omega)$" should read --$\hat{\epsilon}(\omega)$--. Column 7, line 34, "$\epsilon(\omega)$" should read --$\hat{\epsilon}(\omega)$--. Column 9, line 4, "$\lambda_\ell$" should read --$\gamma_\ell$--; line 5, "$\epsilon(\omega_\ell + i\lambda_\ell)$" should read --$\hat{\epsilon}(\omega_\ell + i\lambda_\ell^\gamma)$--, "$\epsilon$" should read --$\hat{\epsilon}$--; line 10, "$\epsilon(\omega)$" should read --$\hat{\epsilon}(\omega)$--; line 39, "$I_2$" should read --$I_2^*$--.

In the claims, column 10, line 39, "electomagnetic" should read --electromagnetic--; line 66, "in" should be deleted.

Signed and Sealed this

Second Day of July 1985

[SEAL]

*Attest:*

DONALD J. QUIGG

*Attesting Officer*  *Acting Commissioner of Patents and Trademarks*